United States Patent [19]
Yeh et al.

[11] Patent Number: 5,607,099
[45] Date of Patent: Mar. 4, 1997

[54] SOLDER BUMP TRANSFER DEVICE FOR FLIP CHIP INTEGRATED CIRCUIT DEVICES

[75] Inventors: Shing Yeh, Buffalo Grove, Ill.; William D. Higdon, Greentown; Ralph E. Cornell, Kokomo, both of Ind.

[73] Assignee: Delco Electronics Corporation, Kokomo, Ind.

[21] Appl. No.: 426,861

[22] Filed: Apr. 24, 1995

[51] Int. Cl.$^6$ ................................................. H01L 21/44
[52] U.S. Cl. ........................... 228/180.22; 437/183
[58] Field of Search .................... 228/180.22, 253; 437/183; 216/2

[56] References Cited

U.S. PATENT DOCUMENTS

| | | | |
|---|---|---|---|
| 4,733,823 | 3/1988 | Waggener et al. | 216/2 X |
| 5,118,584 | 6/1992 | Evans et al. | 430/313 |
| 5,219,117 | 6/1993 | Lin | 228/253 |
| 5,220,200 | 6/1993 | Blanton | 257/778 |
| 5,261,593 | 11/1993 | Casson et al. | 228/180.22 |

FOREIGN PATENT DOCUMENTS

| | | | |
|---|---|---|---|
| 26030 | 1/1990 | Japan | 437/183 |
| 263433 | 9/1992 | Japan | 437/183 |

*Primary Examiner*—Kenneth J. Ramsey
*Attorney, Agent, or Firm*—Jimmy L. Funke

[57] ABSTRACT

A carrier device (10) is provided for transferring solder bumps (16) to a surface of a flip chip integrated circuit device (18). The carrier device (10) is equipped with cavities (12) on its surface for receiving and retaining solder material (14), by which the solder material (14) can be transferred to the flip chip (18) as molten solder bumps (16). The cavities (12) are located on the surface of the carrier device (10) such that the location of the solder material (14) will correspond to the desired solder bump locations on the flip chip (18) when the carrier device (10) is registered with the flip chip (18). The size of the cavities (12) can be controlled in order to deliver a precise quantity of solder material (14) to the flip chip (18).

6 Claims, 1 Drawing Sheet

SOLDER BUMP TRANSFER DEVICE FOR FLIP CHIP INTEGRATED CIRCUIT DEVICES

The present invention generally relates to devices and methods for transferring solder bumps to flip chip integrated circuit devices.

BACKGROUND OF THE INVENTION

A flip chip is generally a monolithic semiconductor device, such as an integrated circuit, having bead-like terminals formed on one surface of the chip. The terminals, commonly referred to as solder bumps, serve to both secure the chip to a circuit board and electrically interconnect the flip chip's circuitry to a conductor pattern formed on the circuit board, which may be a ceramic substrate, printed wiring board, flexible circuit, or a silicon substrate.

Due to the numerous functions typically performed by the microcircuitry of a flip chip, a relatively large number of solder bumps are typically required. Typically, each solder bump is located at the perimeter of the flip chip on an electrically conductive pad that is electrically interconnected with the circuitry on the flip chip. The size of a typical flip chip is generally on the order of a few millimeters per side. As a result, flip chip conductor patterns are typically composed of numerous individual conductors, often spaced on the order of about 0.2 millimeter apart.

Placement of the solder bumps on a flip chip must be precisely controlled not only to coincide with the spacing of the conductors, but also to control the height of the solder bumps after soldering. Controlling the height of solder bumps after reflow is necessary in order to prevent the surface tension of the molten solder bumps from drawing the flip chip excessively close to the substrate during the bonding operation. Sufficient spacing between the chip and its substrate is necessary for enabling stress relief during thermal cycles, allowing penetration of cleaning solutions for removing undesirable residues, and enabling the penetration of mechanical bonding and encapsulation materials between the chip and its substrate.

Because of the narrow spacing required for the solder bumps, the forming of solder bumps on a flip chip requires a significant degree of precision. For this reason, reflow solder methods are widely utilized to form solder bumps on flip chips, as well as to solder flip chips to a substrate. For example, reflow solder methods are employed to form solder bumps on the surface of the flip chip in conjunction with a solder bump transfer technique. Such techniques involve physically transferring solder to the surface of the flip chip and then heating, or reflowing, the solder to form solder bumps that adhere to the flip chip. The flip chip is then soldered to its conductor pattern by registering the solder bumps with their respective conductors and reflowing the solder so as to metallurgically bond the chip to the conductor pattern, and thereby electrically interconnect each of the solder bumps with its corresponding conductor.

One known solder bump transfer technique is to place preformed solder balls on the surface of a chip, typically onto a solder pad formed on the flip chip, using a precision placement machine. Once in place, the solder balls are reflowed, causing the solder balls to adhere to the solder pad and form the characteristic solder bumps. A significant disadvantage associated with this approach is the processing costs due to the limited process reliability and speed of the pick-and-place nature of the transfer process. Another disadvantage is that physical placement of each solder ball with a machine dictates a minimum spacing between solder bumps on the flip chip, and therefore artificially requires a larger flip chip than would otherwise be necessary for the flip chip circuitry.

A second known solder bump transfer technique is to form solder bumps on the surface of a carrier chip by masking and plating the carrier chip with a platable solder alloy, stripping the mask, and then reflowing the solder plating to form solder balls on the surface of the carrier chip. Thereafter, the carrier chip is heated to liquefy the solder balls, and then registered with a flip chip to transfer the solder balls to the flip chip.

A significant disadvantage associated with this approach is that the process is limited to platable solder compositions. Due to the process control limitations of conventional plating processes, the final alloy composition of the solder bumps may not be controlled to the degree necessary to reliably achieve desired solder bond strength and electrical characteristics for the flip chip. Furthermore, the solder plating process is characterized by many steps, which thereby raises the costs for this transfer technique.

In view of the above, it can be seen that the two solder bump transfer techniques described above have significant shortcomings that complicate the formation of solder bumps on a flip chip and/or increase the processing costs for flip chip fabrication. Accordingly, it would be desirable if a solder bump transfer technique were available that was cost effective, reliable, and relatively rapid, promoted minimal spacing between solder bumps on a flip chip, and did not necessitate the use of a plating process to form the solder bumps.

SUMMARY OF THE INVENTION

It is an object of this invention to provide a carrier device for transferring solder bumps to solder bump locations on a surface of a flip chip integrated circuit device, wherein the carrier device is equipped with cavities on its surface for receiving and retaining a quantity of solder material, by which the solder material can be transferred to a flip chip to form solder bumps on the flip chip. As such, the present invention also provides a solder bump transfer method by which solder bumps can be transferred to the surface of a flip chip. Preferably, the carrier device and the solder bump transfer method of this invention yield a cost effective, reliable, and relatively rapid process that promotes minimal spacing between solder bumps on a flip chip, and that does not necessitate the use of a platable solder composition.

According to the present invention, there is provided a carrier device having a surface in which cavities are formed. Each of the cavities is adapted to receive and retain a quantity of solder material for forming solder bumps on a flip chip integrated circuit device. The solder material is reflowed while resident in the cavities to form a solder ball that is secured within each of the cavities. The cavities are located on the surface of the carrier device such that the location of the solder balls will correspond to the desired solder bump locations on the flip chip wafer when the carrier device is registered with the flip chip wafer.

The cavities may be aligned along the perimeter of the carrier device so as to correspondingly form solder bumps at the perimeter of the flip chip integrated circuit device. In a preferred embodiment, the cavities extend into the surface of the carrier device, with each cavity having a tapered portion so as to have a greater width at the surface of the carrier device than at the bottom of the cavity. The tapered portion of each cavity is preferably disposed adjacent the surface of the carrier device, and serves to center the solder material at the approximate center of the cavity as well as to cause the solder ball to project above the first surface of the carrier device following reflow.

The solder bump transfer method made possible by this invention generally involves providing a carrier device in accordance with the above. A suitable solder material is then deposited in each of the cavities, and the solder material is melted so as to form solder balls whose size and shape are dictated by the size and shape of the cavities. The carrier device is then aligned with a flip chip integrated circuit device wafer, and heated so as to liquefy the solder balls in the cavities. Finally, the carrier device is contacted with the flip chip wafer such that the solder balls wet and transfer to the flip chip wafer, In view of the above, it can be seen that a significant advantage of this invention is that the cavities can be shaped and sized to receive a precise quantity of solder material which, after reflow, will form a solder ball that can be readily transferred to a flip chip. Because the transfer mechanism employed by the present invention involves the presence of cavities in the surface of the carrier device, a fine pitch can be achieved for the solder bumps on a flip chip by appropriately spacing the cavities apart relative to each other on the carrier device. Such a transfer mechanism is relatively uncomplicated and requires minimal steps and time to complete the transfer operation.

Another advantage of the present invention is that a wide variety of solder alloys can be employed by this invention, since the method does not require a plating operation that would otherwise limit the types of solder alloys that can be deposited on the carrier device. Furthermore, the composition of a solder alloy used with the invention can be precisely controlled to achieve the required solder bond strength and electrical characteristics.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 2:
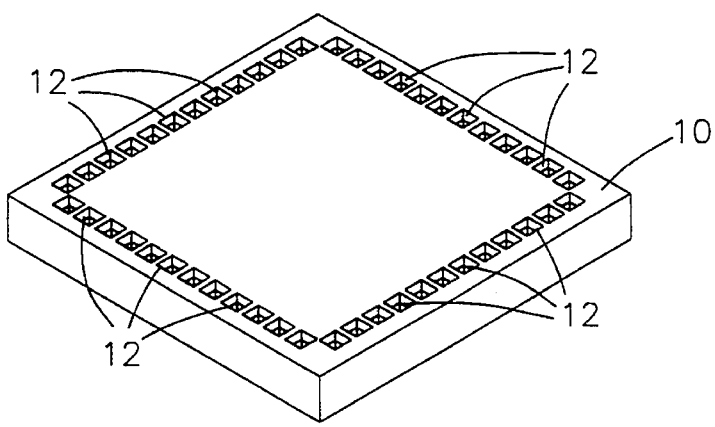
FIG. 2 is a perspective view of a carrier device configured in accordance with this invention.
Figure 3:
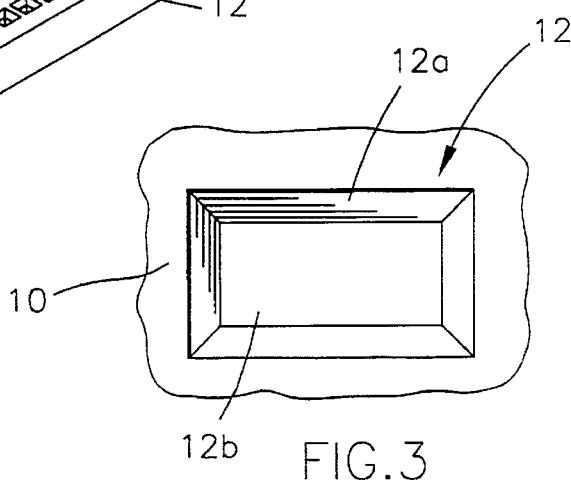
FIG. 3 is a top view of a cavity formed in the carrier device of FIG. 2.

With reference to FIGS. 2 and 3, there is illustrated a solder bump carrier 10 configured in accordance with this invention. As shown, the carrier device 10 is adapted to transfer solder bumps to a surface of a flip chip integrated circuit device, and enables a solder bump transfer method that is reliable, rapid and cost effective. The carrier device 10 of this invention is capable of achieving minimal spacing between solder bumps on a flip chip, so as to optimize the size of a flip chip for its intended circuitry.

As shown in FIG. 2, the carrier device 10 is a die that has been separated from a silicon wafer, with a number of cavities 12 being present in the surface of the die along its perimeter. In this configuration, the carrier device 10 is adapted to transfer solder bumps to a single flip chip. Alternatively, the carrier device 10 can be formed as a silicon wafer composed of a number of identical or dissimilar dies, with each die having a number of cavities 12 formed along its perimeter. As such, solder bumps can be simultaneously transferred to multiple flip chip integrated circuit devices or an entire circuit board, such as a hybrid circuit board. Furthermore, it is foreseeable that cavities 12 could be formed anywhere on the surface of the die, and not just at the perimeter of the die. Each of the above variations to the carrier device 10 are within the scope of the present invention.

The surface in which the cavities 12 are formed is preferably the (100) crystallographic plane of the wafer, such that an anisotropic silicon etch can be employed that etches the (100) plane faster than the (111) plane, thereby generating cavities 12 as generally depicted in FIG. 3. As will become apparent, the spacing of the cavities 12 along the perimeter of the die directly corresponds to the placement of solder bumps on the target flip chip die. As is generally conventional, solder bumps are formed at the perimeter of a flip chip in order to allow each solder bump to uniquely register with a conductor of a conductor pattern formed on a substrate to which the flip chip is to be mounted.

The cavities 12 are preferably formed in the surface of the die with an anisotropic etchant, such as pyrocatechol ethylenediamine, in accordance with techniques known in the art, although other etchants could also be used. Etching techniques permit a minimum spacing between cavities 12 of about ten micrometers, though closer spacing is foreseeable. Due to the manner in which the die is masked to form the cavities 12, the cavities 12 of the carrier device 10 illustrated in FIG. 2 generally define square-shaped or rectangular openings in the surface of the die, though this shape is not required to achieve the objects of this invention.

The thickness of the die may vary according to the manner in which the carrier device 10 will be handled in use. A preferred thickness is at least about 350 millimeters, which enables the cavities 12 to have a depth that can accommodate a sufficient quantity of solder material. As noted above, the preferred anisotropic etchant generates the tapered shape 12a for the cavities 12, as illustrated in FIG. 3, such that each cavity 12 has a greater width at the surface of the die than its base surface 12b at the bottom of the cavity 12. Each cavity 12 is sized to receive and retain a desired quantity of solder material, such as a solder paste that upon reflow will form a solder ball which can be readily transferred to a flip chip. In practice, a cavity 12 forming a square-shaped opening having a width of about 300 micrometers at the surface of the die and a width of about 125 micrometers at its base surface 12b has been found to be suitable, though it is foreseeable that significantly greater or lesser widths could be employed. For example, FIG. 3 illustrates a cavity 12 that forms a rectangular-shaped opening at the surface of the die, in which the above-noted dimensions may correspond to the shorter dimensions for the opening and the base surface 12b.

Figure 1A:
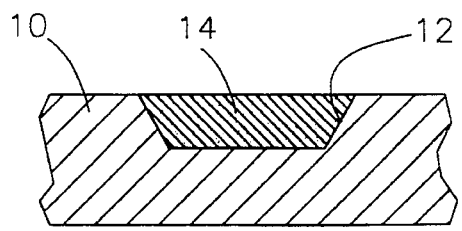
FIGS. 1a through 1d illustrate the process steps made possible with the use of a solder bump carrier device configured in accordance with an embodiment of the present invention.

The solder bump transfer method made possible by the carrier device 10 of this invention is illustrated in FIGS. 1a through 1d. FIG. 1a represents in cross-section the carrier device 10, which is generally identical to that illustrated in FIGS. 2 and 3. FIG. 1a shows the cavity 12 as being filled with a quantity of solder material 14, which is preferably in the form of a solder paste of a type known in the art. Solder pastes can be composed of a wide variety of compositions, such as a commercially available tin-lead solder paste, though other solder paste compositions are known and can be employed with the method of this invention.

In the form of a paste, the solder material 14 can be applied to the surface of the carrier device 10 using known printing methods and/or forced into the cavities 12 with a squeegee or other suitable device.

Figure 1B:
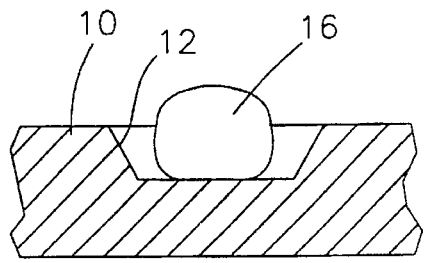

FIG. 1b represents the condition of the solder material 14 after reflow, during which the carrier device 10 is heated to a temperature above the melting temperature of the solder material 14 and sufficient to volatilize any binder in the material 14. As shown, the molten solder material 14 naturally coalesces to form a droplet, or solder ball 16, whose lateral flow is limited by the size and shape of the cavity 12. By sizing the cavity 12 to properly limit the amount of solder material 14 deposited within the cavity 12, the surface tension of the molten solder material 14 is able to produce a solder ball 16 having the substantially spherical shape shown in Figure 1b. Notably, the solder ball 16 is centered within the cavity 12 by the tapered walls of the cavity 12, and projects slightly above the surrounding surface of the die, preferably by as much as about thirty to forty micrometers.

Figure 1C:
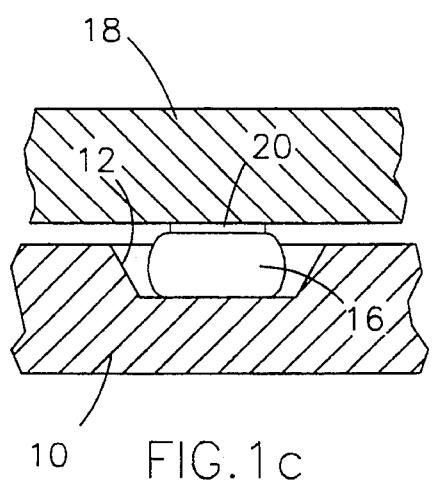
Figure 1D:
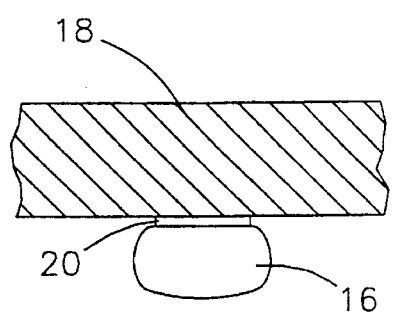

FIG. 1c illustrates the carrier device 10 as being aligned with and contacting a flip chip 18 after the carrier device 10 has been sufficiently heated to liquefy the solder ball 16. As such, the molten solder ball 16 is able to wet and transfer to the flip chip 18 during this step of the transfer method. As is conventional, the flip chip 18 is illustrated as being equipped with a solder pad 20 that promotes a metallurgical bond between the solder ball 16 and the flip chip 18. Finally, FIG. 1d illustrates the solder ball 16 as a solder bump on the surface of the flip chip 18, after the carrier device 10 has been retracted.

The above method was observed with a number of carrier devices formed from (100) silicon wafers that were etched to form cavities in accordance with that shown in FIGS. 2 and 3. The cavities were characterized by a width at the wafer surface of about 300 micrometers and about 125 micrometers at the bottom of each cavity. The depth of each cavity was on the order of about 100 to about 115 micrometers. Spacing between cavities was on the order of about 150 micrometers.

A 63/37 tin-lead solder paste was printed over each carrier device so as to completely fill the cavities. The solder paste was then reflowed to form solder balls. Each carrier device was then registered with a flip chip die. Some of the flip chips were equipped with a nickel vanadium-copper-gold solder pad, while others were equipped with copper pads. The carrier devices were then heated to about 245° C. to liquefy the solder balls and complete the solder bump transfer process. The resulting solder bumps on the flip chips had a bump height of about 110 to about 120 micrometers and an average diameter of about 215 micrometers. While the shape of the solder bumps were somewhat flat, the amount of solder transferred was deemed sufficient to provide adequate chip elevation for reliability and epoxy underfill.

From the above, it can be seen that a significant advantage of this invention is that the carrier device 10 is capable of transferring a precise amount of solder material to form a solder bump on a flip chip integrated circuit device. More specifically, the carrier device 10 of this invention is equipped with cavities 12 that can be properly shaped and sized to receive a precise quantity of solder material which, after reflow, will form a solder ball that can be readily transferred to a flip chip. Because the cavities 12 serve as the transfer mechanism for the carrier device 10, a fine solder bump pitch can be achieved on a flip chip by appropriately spacing the cavities 12 apart on the carrier device 10. As such, the transfer mechanism of the carrier device 10 is relatively uncomplicated and requires minimal steps and time to complete the transfer operation.

Another significant advantage of the present invention is that a wide variety of solder alloys can be employed by this invention, since the method does not require a plating operation that would otherwise limit the types of alloys that can be deposited on the carrier device 10. Consequently, the composition of a solder alloy transferred with the carrier device 10 can be precisely controlled to achieve the required solder bond strength and electrical characteristics.

In addition, use of the carrier device 10 of this invention can generally proceed with known solder deposition techniques and with alignment devices currently available in the art. As such, the present invention is not complicated by processing steps that require significant amounts of additional time, material or equipment, apart from that often entailed in flip-chip processing and bonding procedures.

Finally, the carrier device 10 of this invention could foreseeably be employed to transfer solder bumps to surfaces other than a single flip chip. For example, the carrier device 10 can be configured to transfer solder bumps to a number of dies delineated on a wafer, such that solder bumps are simultaneously transferred to multiple flip chip integrated circuit devices or an entire circuit board, such as a hybrid circuit board.

Accordingly, while our invention has been described in terms of a preferred embodiment, it is apparent that other forms could be adopted by one skilled in the art—for example, by modifying the shape and size of the carrier device and/or the cavities, or by substituting appropriate materials. Accordingly, the scope of our invention is to be limited only by the following claims.

What is claimed is:

1. A method for transferring solder bumps to solder bump locations on a surface of a flip chip integrated circuit device, the method comprising the steps of:

providing a carrier device having cavities located on a surface thereof so as to correspond to the solder bump locations on the flip chip integrated circuit device when the carrier device is registered with the flip chip integrated circuit device, each cavity being defined by walls and a bottom that is substantially parallel with the surface of the carrier device, the walls of each cavity being continuously tapered between the surface of the carrier device and the bottom of the cavity such that the cavity has a greater width at the surface of the carrier device than at the bottom of the cavity;

depositing a solder paste in the cavities;

melting the solder paste so as to form spherical solder balls, the walls of the cavities causing the solder balls to be centered within the cavities while the solder balls are molten such that the surfaces of the solder balls are spaced apart from the walls;

aligning the carrier device with the flip chip integrated circuit device and heating the carrier device so as to liquefy the solder balls in the cavities; and contacting the carrier device with the flip chip integrated circuit device such that the solder balls wet and transfer to solder pads present on the flip chip integrated circuit device.

2. A method as recited in claim 1 wherein the cavities are aligned on the surface of the carrier device so as to form solder bumps at the perimeter of the flip chip integrated circuit device during the contacting step.

3. A method as recited in claim 1 wherein the carrier device comprises a silicon wafer.

4. A method as recited in claim 3 wherein the surface is a (100) crystallographic plane of the silicon wafer.

5. A method as recited in claim 1 wherein the depositing step comprises printing the solder paste in the cavities.

6. A method as recited in claim 1 wherein the carrier device comprises a die separated from a silicon wafer.

* * * * *